(12) United States Patent
Lim et al.

(10) Patent No.: US 6,888,868 B2
(45) Date of Patent: May 3, 2005

(54) SEMICONDUCTOR LASER DEVICE AND MANUFACTURING METHOD THEREOF

(75) Inventors: Won Taeg Lim, Seoul (KR); Shi Jong Leem, Seoul (KR)

(73) Assignee: LG Electronics Inc., Seoul (KR)

( * ) Notice: Subject to any disclaimer, the term of this patent is extended or adjusted under 35 U.S.C. 154(b) by 298 days.

(21) Appl. No.: 10/314,360

(22) Filed: Dec. 9, 2002

(65) Prior Publication Data
US 2003/0118070 A1 Jun. 26, 2003

(30) Foreign Application Priority Data
Dec. 10, 2001 (KR) ................................ 10-2001-0077749

(51) Int. Cl.[7] ................................................. H01S 5/00
(52) U.S. Cl. ........................................ 372/45; 372/46
(58) Field of Search .............................. 372/43–54, 75, 372/96

(56) References Cited

U.S. PATENT DOCUMENTS

| | | | | |
|---|---|---|---|---|
| 4,656,638 A | * | 4/1987 | Tihanyi et al. ................. | 372/49 |
| 4,815,089 A | * | 3/1989 | Miyauchi et al. .............. | 372/49 |
| 4,951,291 A | * | 8/1990 | Miyauchi et al. .............. | 372/49 |
| 5,960,021 A | * | 9/1999 | De Vrieze et al. ............. | 372/49 |
| 5,962,873 A | | 10/1999 | Ohkubo et al. | |
| 6,067,310 A | * | 5/2000 | Hashimoto et al. ........... | 372/49 |
| 6,359,921 B1 | * | 3/2002 | Yamanaka .................... | 372/49 |

FOREIGN PATENT DOCUMENTS

JP 2000-068582 3/2000

* cited by examiner

Primary Examiner—Minsun Oh Harvey
Assistant Examiner—Tuan N. Nguyen
(74) Attorney, Agent, or Firm—Fleshner & Kim, LLP

(57) ABSTRACT

Disclosed is a semiconductor laser device and manufacturing method thereof in which light absorption in a facet decreases and stable high power laser beam is generated. The semiconductor laser device having a stack structure in which a lower clad layer, an active layer, an upper clad layer, a current blocking layer, and a cap layer are sequentially formed, the semiconductor laser device includes: a Zn diffusion source layer on a facet of the stack structure; and a window layer between the Zn diffusion source layer and the stack structure, for preventing light absorption.

20 Claims, 4 Drawing Sheets

SEMICONDUCTOR LASER DEVICE AND MANUFACTURING METHOD THEREOF

This application claims the benefit of the Korean Application No. P 2001-77749 filed on Dec. 10, 2001, which is hereby incorporated by reference.

BACKGROUND OF THE INVENTION

1. Field of the Invention

The present invention relates to a semiconductor laser device, and more particularly, to a semiconductor laser device with a high power and a manufacturing method thereof.

2. Discussion of the Related Art

Recently, with the high speed of the optical storage media such as CD-RW and DVD, there is requested a need of a laser semiconductor device with a high power.

FIG. 1 is a perspective view of a chip bar of a conventional semiconductor laser diode. A single semiconductor laser diode includes an n-type GaAs clad layer 2, an active layer 3, and a p-type AlGaAs clad layer 4 sequentially stacked on a GaAs substrate 1. A current preventive layer 5 is formed on a sidewall of the p-type AlGaAs clad layer 4. A p-type GaAs cap layer 6 is stacked on the p-type AlGaAs clad layer 4 and the current preventive layer 5. An n-type metal layer 7 is formed below the GaAs substrate 1. A p-type metal layer 8 is formed on the p-type cap layer 6. The semiconductor laser diodes each having the aforementioned construction are aligned to form a chip bar for the semiconductor laser diodes.

Laser beams irradiated from the active layer 3 are used to read/write data from/to CD-RW or DVD. However, as the power of the semiconductor laser diode increases, catastrophic optical damage (COD) generated in the facet is on the rise as a serious problem.

The catastrophic optical damage is generated when there exists a defect in the facet or when the laser beam generated from the active layer 3 is not sufficiently reflected on the facet and is absorbed, so that the laser beam is converted into heat and the heat increases the power of the semiconductor laser diode. If the power of the semiconductor laser diode is increased, more amount of laser beam is absorbed in the facet, so that the semiconductor laser diode is damaged within a short time.

In order to prevent the aforementioned catastrophic optical damage, various methods were tried but these methods cause new problems.

As a first example, there is a method in which sulfur treatment is carried out in the surface of the facet. However, this method causes a contamination due to the use of wet process.

As a second example, the non-absorbing layer is made of a material having an energy band gap greater than that of the active layer to effectively restrain the COD. However, in order to increase the energy band gap by using an impurity, it is necessary to use dimethyl zinc in gas status as a main component. Also, in order to diffuse impurities only into a desired portion, the mask layer is essentially needed. As a result, since the number of the added processes increases, the method is disadvantageous in the aspect of the fabrication efficiency.

SUMMARY OF THE INVENTION

Accordingly, the present invention is directed to a semiconductor laser device and manufacturing method thereof that substantially obviates one or more problems due to limitations and disadvantages of the related art.

An object of the present invention is to provide a semiconductor laser device and manufacturing method thereof in which light absorption in a facet decreases and stable high power laser beam is generated.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor laser device having a stack structure in which a lower clad layer, an active layer, an upper clad layer, a current blocking layer, and a cap layer are sequentially formed, the semiconductor laser device includes: a Zn diffusion source layer formed on a facet of the stack structure; and a window layer arranged between the Zn diffusion source layer and the stack structure, for preventing light absorption.

In another aspect of the present invention, a semiconductor laser device having a stack structure in which a lower clad layer, an active layer, an upper clad layer, a current blocking layer, and a cap layer are sequentially formed, the semiconductor laser device includes: first and second Zn diffusion source layers formed on a facet of the stack structure and at an opposite side of the facet respectively; first and second window layers formed on the stack structure by a Zn diffusion from the first and second Zn diffusion source layers; an anti-reflection mirror layer formed at an outer surface of the first Zn diffusion source layer; and a high-reflection mirror layer formed at an outer surface of the second Zn diffusion source layer.

In another aspect of the present invention, there is provided a method for manufacturing a semiconductor laser device having a stack structure in which a lower clad layer, an active layer, an upper clad layer, a current blocking layer, and a cap layer are sequentially formed. The method includes the steps of: (1) forming first and second Zn diffusion source layers in a facet of the stack structure and at an opposite side of the facet respectively; (2) forming an anti-reflection mirror layer at an outer surface of the first Zn diffusion source layer and a high-reflection mirror layer at an outer surface of the second Zn diffusion source layer; and (3) diffusing Zn into the stack structure from the first and second Zn diffusion source layer through a heat treatment.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A semiconductor laser device according to the present invention is characterized that a Zn diffusion source layer is formed on a facet and Zn atoms are diffused from the Zn diffusion source layer through a thermal treatment to form a window layer.

First Embodiment

Figure 1:
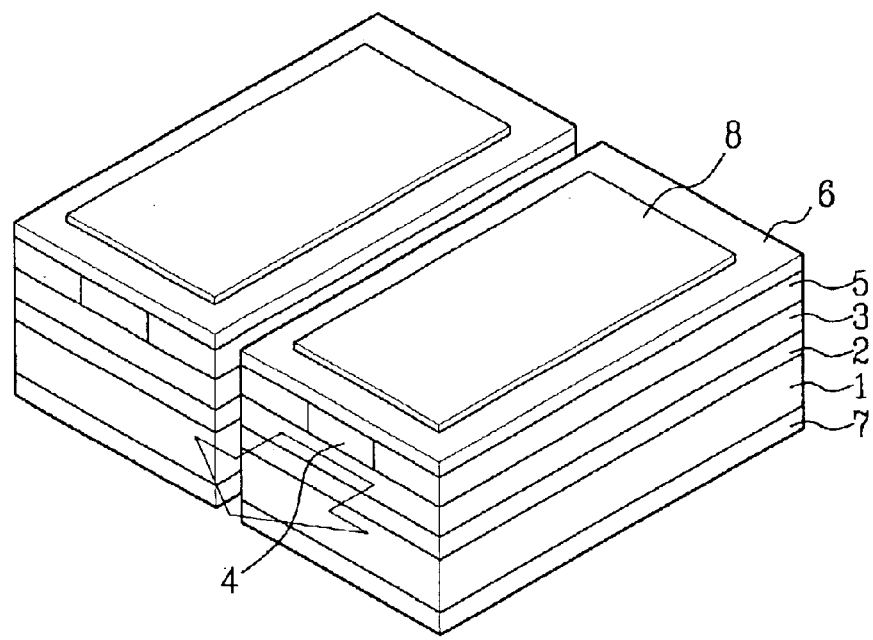
FIG. 1 is a perspective view of a chip bar of a conventional semiconductor laser diode.
Figure 2:
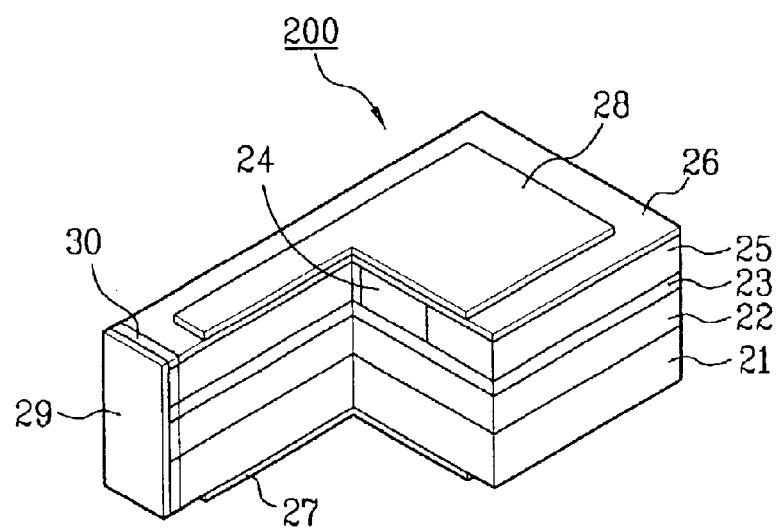
FIG. 2 is a perspective view of a semiconductor laser device according to a first embodiment of the present invention.

FIG. 2 is a perspective view of a semiconductor laser device according to a first embodiment of the present invention.

As shown in FIG. 2, a semiconductor laser device according to a first embodiment of the present invention, includes an n-type GaAs clad layer 22, an active layer 23, and a p-type AlGaAs clad layer 24 sequentially formed on a GaAs substrate 21, a current blocking layer 25 formed at both sides of the p-type AlGaAs clad layer 24, a p-type GaAs cap layer 26 formed on the p-type AlGaAs clad layer 24 and the current blocking layer 25, an n-type metal layer 27 formed beneath the GaAs substrate 21, and a p-type metal layer 28 formed on the p-type GaAs cap layer 26. Here, the n-type GaAs clad layer 22, the active layer 23 and the p-type AlGaAs clad layer 24 constitute an oscillation layer for generating a laser beam.

In addition, the semiconductor laser device further includes a Zn diffusion source layer 29 coated on a facet, and a window layer 30 formed by a diffusion of Zn atoms from the Zn diffusion source layer 29. The Zn diffusion source layer 29 is formed at a thickness of λ/4n or λ/2n (λ: wavelength of irradiated light, n: refractivity of Zn diffusion source layer) from the material of ZnS or ZnO.

Here, the window layer 30 serves as a non-absorbing layer preventing light absorption by the diffused Zn atoms, and the Zn diffusion source layer 29 serves as an anti-reflection mirror facet or a passivation layer.

A manufacturing method of the semiconductor laser device according to the first embodiment is described as follows.

Figure 3A:
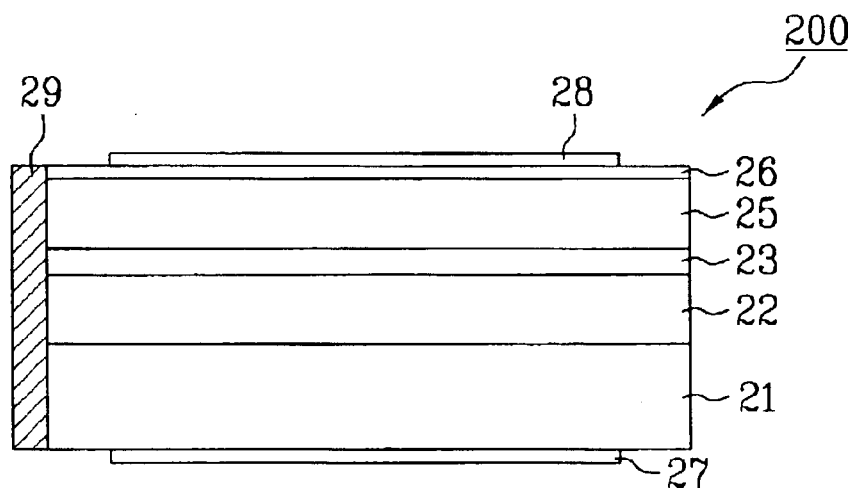
FIGS. 3A and 3B are sectional views for illustrating a manufacturing method of a semiconductor laser device according to a first embodiment of the present invention.
Figure 3B:
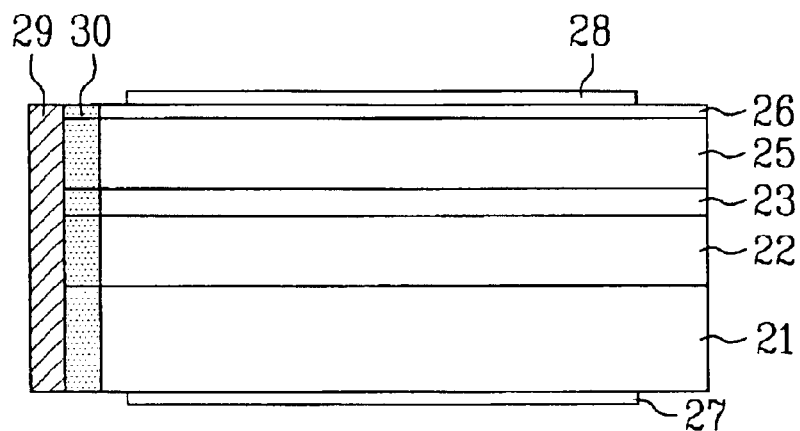

FIGS. 3A and 3B are sectional views for illustrating a manufacturing method of a semiconductor laser device according to a first embodiment of the present invention.

First, as shown in FIG. 3A, an n-type GaAs clad layer 22, an active layer 23, and a p-type AlGaAs clad layer 24 are sequentially formed on a GaAs substrate 21. Both edges of the p-type AlGaAs clad layer 24 are etched such that only a central portion is left in the form of a ridge. After that, a current blocking layer 25 is formed at both sides of the p-type AlGaAs clad layer 24 having the ridge shape.

Afterwards, a p-type GaAs cap layer 26 is formed on the p-type AlGaAs clad layer 24 and the current blocking layer 25. An n-type metal layer 27 is formed beneath the GaAs substrate 21, and then a p-type metal layer 28 is formed on the p-type GaAs cap layer 26. Here, the n-type metal layer 27 and the p-type metal layer 28 are patterned such that a predetermined portion of their outer edges is removed. As a result of the aforementioned processes, a stack structure 200 having a plurality of layers is formed.

After that, a Zn diffusion source layer 29 is coated on a facet of the stack structure. The Zn diffusion source layer 29 is in contact with the GaAs substrate 21, the n-type GaAs clad layer 22, the active layer 23, the p-type AlGaAs clad layer 24, the current blocking layer 25, and the p-type GaAs cap layer 26.

At this time, the Zn diffusion source layer 29 is formed by an RF sputtering method, a plasma enhanced chemical vapor deposition (PECVD) method, an E-beam evaporation method, or a thermal evaporation method. The Zn diffusion source layer 29 is made of ZnS or ZnO.

The Zn diffusion source layer 29 can serve as an anti-reflection mirror facet for a generated laser beam or a passivation layer. In case the Zn diffusion source layer 29 is used as the anti-reflection mirror facet, it is preferably deposited at a thickness of λ/4n (λ: wavelength of irradiated light, n: refractivity of Zn diffusion source layer). In case the Zn diffusion source layer 29 is used as the passivation layer, it is preferably deposited at a thickness of λ/2n.

After that, as shown in FIG. 3B, the Zn atoms of the Zn diffusion source layer 29 are diffused into the stack structure 200 through a thermal treatment to form a window layer 30. In other words, the Zn atoms are diffused into the GaAs substrate 21, the n-type GaAs clad layer 22, the active layer 23, the p-type AlGaAs clad layer 24, the current blocking layer 25 and the p-type GaAs cap layer 26 all of which are in contact with the Zn diffusion source layer 29.

The thermal treatment process is carried out by a heat treatment in a furnace or a rapid thermal annealing (RTA) method at a temperature of approximately 450° C. By the above thermal treatment process, excess Zn atoms of the Zn diffusion source layer 29 are diffused into the stack structure 200 adjacent to the facet to form the window layer 30.

The semiconductor laser device according to the first embodiment inhibits the temperature elevation in the facet to thus stably generate a laser beam with a high power.

Second Embodiment

A semiconductor laser device according to a second embodiment of the present invention is similar to that of the first embodiment, but has differences in that the Zn diffusion source layers and the window layers are respectively formed on the facet and the opposite side of the facet, and anti-reflection mirror layer and high-reflection mirror layer are further formed on an outer surface of the Zn diffusion source layers.

Figure 4:
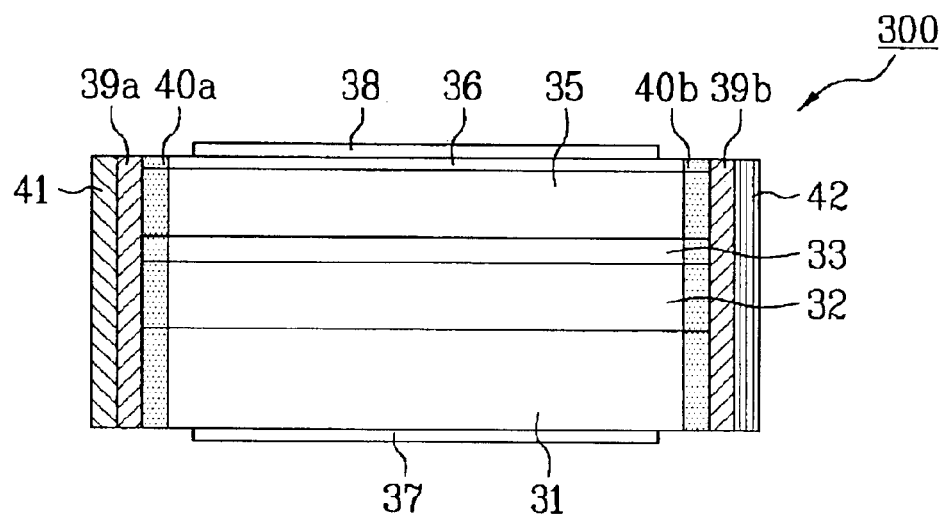
FIG. 4 is a sectional view of a semiconductor laser device according to a second embodiment of the present invention.

FIG. 4 is a sectional view of a semiconductor laser device according to a second embodiment of the present invention.

As shown in FIG. 4, a semiconductor laser device according to a second embodiment of the present invention, includes an n-type GaAs clad layer 32, an active layer 33, and a p-type AlGaAs clad layer 34 sequentially formed on a GaAs substrate 31, a current blocking layer 35 formed at both sides of the p-type AlGaAs clad layer 34, a p-type GaAs cap layer 36 formed on the p-type AlGaAs clad layer 34 and the current blocking layer 35, an n-type metal layer 37 formed beneath the GaAs substrate 31, and a p-type metal layer 38 formed on the p-type GaAs cap layer 36. Here, the n-type GaAs clad layer 32, the active layer 33 and the p-type AlGaAs clad layer 34 constitute an oscillation layer for generating a laser beam.

In addition, the semiconductor laser device according to the second embodiment of the invention further includes first and second Zn diffusion source layers 39a and 39b coated on a facet and an opposite side of the facet, a first window layer 40a formed by a diffusion of Zn atoms from the first Zn diffusion source layer 39a into a stack structure 300, a second window layer 40b formed by a diffusion of Zn atoms from the second Zn diffusion source layer 39b into an opposite side of the stack structure 300, an anti-reflection mirror layer 41 formed at an outer surface of the first Zn diffusion source layer 39a, and a high-reflection mirror layer 42 formed at an outer surface of the second Zn diffusion source layer 39b. Here, the first and second window layers 40a and 40b serve as a non-absorbing layer by the diffused Zn atoms.

The first and second Zn diffusion source layers 39a and 39b are formed at a thickness of $\lambda/4n$ or $\lambda/2n$ ($\lambda$: wavelength of irradiated light, n: refractivity of Zn diffusion source layer) from the material of ZnS or ZnO. Here, the anti-reflection mirror layer 41 is made of $Al_2O_3$ or $SiO_2$, and the high-reflection mirror layer 42 is formed of a plurality of thin films in which $SiO_2$ and $TiO_2$ are repeatedly (or alternatively) deposited.

A manufacturing method of the semiconductor laser device according to the second embodiment is described as follows.

Figure 5A:
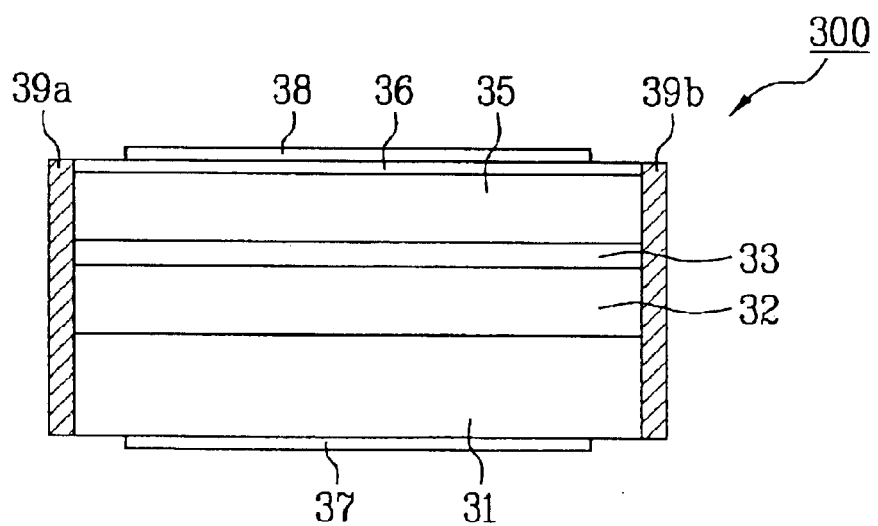
FIGS. 5A to 5C are sectional views for illustrating a manufacturing method of a semiconductor laser device according to the second embodiment of the present invention.
Figure 5B:
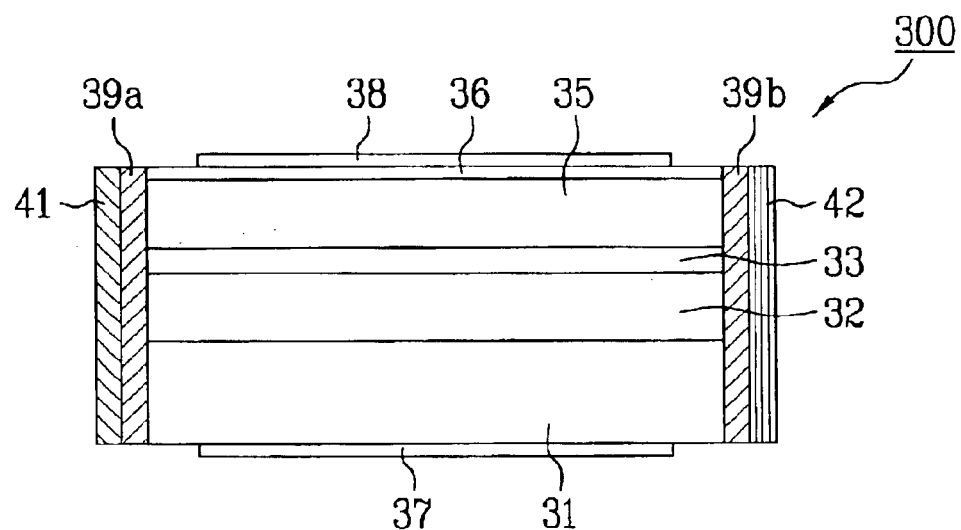
Figure 5C:
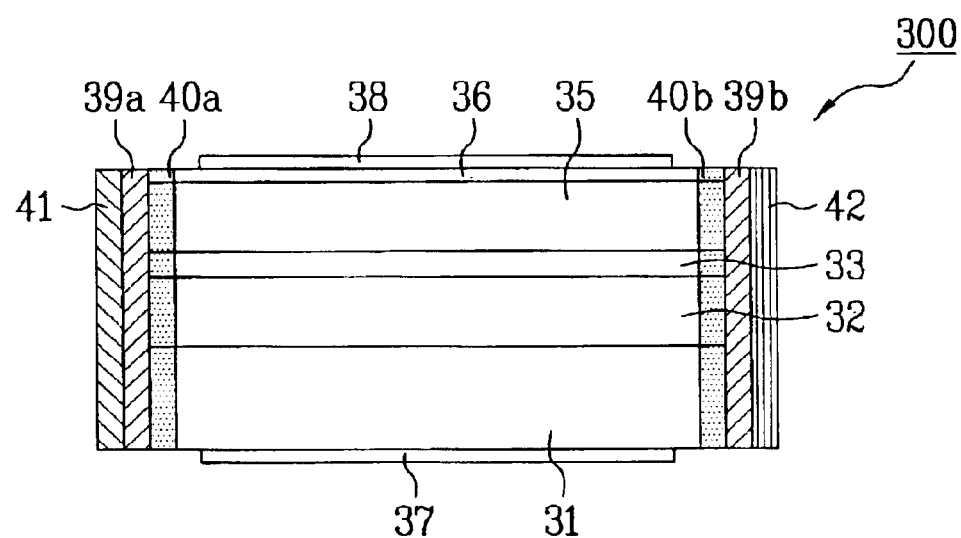

FIGS. 5A to 5C are sectional views for illustrating a manufacturing method of a semiconductor laser device according to a second embodiment of the present invention.

First, as shown in FIG. 5A, an n-type GaAs clad layer 32, an active layer 33, and a p-type AlGaAs clad layer 34 are sequentially formed on a GaAs substrate 31. Both edges of the p-type AlGaAs clad layer 34 are etched such that only a central portion is left in the form of a ridge. After that, a current blocking layer 35 is formed at both sides of the p-type AlGaAs clad layer 34 having the ridge shape.

Afterwards, a p-type GaAs cap layer 36 is formed on the p-type AlGaAs clad layer 34 and the current blocking layer 35. An n-type metal layer 37 is formed beneath the GaAs substrate 31 and a p-type metal layer 38 is formed on the p-type GaAs cap layer 36. Then, the n-type metal layer 37 and the p-type metal layer 38 are patterned such that a predetermined portion of their outer edges is removed. As a result of the aforementioned processes, a stack structure 300 having a plurality of layers is formed.

After that, a first Zn diffusion source layer 39a is formed on a facet of the stack structure 300 and a second Zn diffusion source layer 39b is formed on an opposite side of the facet of the stack structure 300. The first and second Zn diffusion source layers 39a and 39b are formed by an RF sputtering method, a plasma enhanced chemical vapor deposition (PECVD) method, an E-beam evaporation method, or a thermal evaporation method with a material of ZnS or ZnO. Here, since the first and second Zn diffusion source layers 39a and 39b are only used as sources for the diffusion of Zn atoms, they are formed at a thickness of $\lambda/4n$ ($\lambda$: wavelength of irradiated light, n: refractivity of Zn diffusion source layer). The first and second Zn diffusion source layers 39a and 39b are in contact with the GaAs substrate 31, the n-type GaAs clad layer 32, the active layer 33, the p-type AlGaAs clad layer 34, the current blocking layer 35, and the p-type GaAs cap layer 36.

After that, as shown in FIG. 5B, an anti-reflection mirror layer 41 is formed at an outer surface of the first Zn diffusion source layer 39a, and a high-reflection mirror layer 42 is formed at an outer surface of the second Zn diffusion source layer 39b. Here, the anti-reflection mirror layer 41 is made of $Al_2O_3$ or $SiO_2$, and the high-reflection mirror layer 42 is formed of a plurality of thin films in which $SiO_2$ and $TiO_2$ are repeatedly (or alternatively) deposited.

After that, as shown in FIG. 5C, the Zn atoms of the first and second Zn diffusion source layers 39a and 39b are diffused into the stack structure 300 through a thermal treatment to form first and second window layers 40a and 40b. In other words, the Zn atoms are diffused into the GaAs substrate 31, the n-type GaAs clad layer 32, the active layer 33, the p-type AlGaAs clad layer 34, the current blocking layer 35 and the p-type GaAs cap layer 36 all of which are in contact with the first and second Zn diffusion source layers 39a and 39b.

The thermal treatment process is carried out by a heat treatment in a furnace or a rapid thermal annealing (RTA) method at a temperature of approximately 450° C. like the first embodiment.

Since the anti-reflection mirror layer 41 and the high-reflection mirror layer 42 function as a cap during the thermal treatment process, they help the Zn atoms of the first and second Zn diffusion source layers 39a and 39b to be more easily diffused into the first and second window layers 40a and 40b.

As described previously, in the present invention, after the Zn diffusion source layer is formed on a facet of a semiconductor laser device, a window layer having a high band gap is formed by the diffusion of the Zn atoms, so that absorption of a laser beam near the facet can be decreased and a laser beam with a high power can be stably generated.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor laser device having a stack structure in which a lower clad layer, an active layer, an upper clad layer, a current blocking layer, and a cap layer are sequentially formed, the semiconductor laser device comprising:
   a Zn diffusion source layer on a facet of the stack structure in which light is irradiated from; and
   a window layer directly between the Zn diffusion source layer and the stack structure, for preventing light absorption,
   wherein the current blocking layer is formed at both sides of the upper clad layer.

2. The semiconductor laser device of claim 1, wherein the Zn diffusion source layer is formed of ZnO or ZnS.

3. The semiconductor laser device of claim 1, wherein the Zn diffusion source layer has a thickness of $\lambda/4n$, where $\lambda$ is wavelength of irradiated light and n is refractivity of the Zn diffusion source layer.

4. The semiconductor laser device of claim 1, further comprising an anti-reflection mirror layer on an outer sidewall of the Zn diffusion source layer formed on the facet.

5. The semiconductor laser device of claim 4, wherein the Zn diffusion source layer has a thickness of $\lambda/4n$, where $\lambda$ is wavelength of irradiated light and n is refractivity of the Zn diffusion source layer.

6. The semiconductor laser device of claim 1, further comprising:
   a Zn diffusion source layer on an opposite side of the facet; and
   a window layer between the Zn diffusion source layer formed at the opposite side of the facet and the stack structure.

7. The semiconductor laser device of claim 6, wherein the Zn diffusion source layer is formed of ZnO or ZnS.

8. The semiconductor laser device of claim 6, further comprising a high-reflection mirror layer on an outer sidewall of the Zn diffusion source layer formed at the opposite side of the facet.

9. The semiconductor laser device of claim 1, wherein the window layer is doped with Zn.

10. A semiconductor laser device having a stack structure in which a lower clad layer, an active layer, an upper clad layer, a current blocking layer, and a cap layer are sequentially formed, the semiconductor laser device comprising:

first and second Zn diffusion source layers on a facet of the stack structure and on an opposite side of the facet respectively;

first and second window layers formed on the stack structure by a Zn diffusion from the first and second Zn diffusion source layers;

an anti-reflection mirror layer on an outer surface of the first Zn diffusion source layer; and a high-reflection mirror layer on an outer surface of the second Zn diffusion source layer.

11. The semiconductor laser device of claim 10, wherein the first and second Zn diffusion source layers are formed of ZnO or ZnS.

12. The semiconductor laser device of claim 10; wherein the first and second Zn diffusion source layers each has a thickness of $\lambda/4n$, where $\lambda$ is wavelength of irradiated light and n is refractivity of the Zn diffusion source layer.

13. The semiconductor laser device of claim 10, wherein the anti-reflection mirror layer is comprised of $Al_2O_3$ or $SiO_2$.

14. The semiconductor laser device of claim 10, wherein the high-reflection mirror layer is comprised of a plurality of thin films in which $SiO_2$ and $TiO_2$ are repeatedly deposited.

15. A method for manufacturing a semiconductor laser device having a stack structure in which a lower clad layer, an active layer, an upper clad layer, a current blocking layer, and a cap layer are sequentially formed, the method comprising the steps of:

(1) forming first and second Zn diffusion source layers on a facet of the stack structure and on an opposite side of the facet respectively;

(2) forming an anti-reflection mirror layer on an outer surface of the first Zn diffusion source layer and a high-reflection mirror layer on an outer surface of the second Zn diffusion source layer; and (3) diffusing Zn into the stack structure from the first and second Zn diffusion source layer through a heat treatment.

16. The method of claim 15, wherein the first and second Zn diffusion source layers are formed of ZnO or ZnS.

17. The method of claim 15, wherein the first and second Zn diffusion source layers each is formed at a thickness of $\lambda/4n$, where $\lambda$ is wavelength of irradiated light and n is refractivity of the Zn diffusion source layer.

18. The method of claim 15, wherein the anti-reflection mirror layer is formed of $Al_2O_3$ or $SiO_2$.

19. The method of claim 15, wherein the high-reflection mirror layer is formed by repeatedly depositing $SiO_2$ and $TiO_2$.

20. The method of claim 15, wherein the heat treatment is performed at a temperature of about 450° C.

* * * * *